United States Patent
Nishimura

(10) Patent No.: US 11,211,227 B2
(45) Date of Patent: Dec. 28, 2021

(54) MULTI CHARGED PARTICLE BEAM EVALUATION METHOD AND MULTI CHARGED PARTICLE BEAM WRITING DEVICE

(71) Applicant: NuFlare Technology, Inc., Yokohama (JP)

(72) Inventor: Rieko Nishimura, Yokohama (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 17/001,952

(22) Filed: Aug. 25, 2020

(65) Prior Publication Data

US 2021/0074510 A1 Mar. 11, 2021

(30) Foreign Application Priority Data

Sep. 10, 2019 (JP) .............................. JP2019-164710

(51) Int. Cl.
| | |
|---|---|
| H01J 37/00 | (2006.01) |
| H01J 37/317 | (2006.01) |
| H01J 37/04 | (2006.01) |
| H01J 37/304 | (2006.01) |

(52) U.S. Cl.
CPC ........ H01J 37/3177 (2013.01); H01J 37/045 (2013.01); H01J 37/3045 (2013.01); *H01J 2237/0435* (2013.01); *H01J 2237/24578* (2013.01); *H01J 2237/31764* (2013.01)

(58) Field of Classification Search
USPC .................................................. 250/492.22
See application file for complete search history.

(56) References Cited

U.S. PATENT DOCUMENTS

| | | | | | |
|---|---|---|---|---|---|
| 8,872,139 | B2 * | 10/2014 | Nishimura | .......... | H01J 37/3174 |
| | | | | | 250/492.22 |
| 9,036,896 | B2 * | 5/2015 | Touya | ...................... | G06T 7/74 |
| | | | | | 382/149 |
| 9,086,388 | B2 * | 7/2015 | Ogawa | ................. | G01N 21/956 |
| 9,575,010 | B2 * | 2/2017 | Ogawa | ...................... | G03F 1/84 |
| 10,283,314 | B2 * | 5/2019 | Nishimura | .......... | H01J 37/1472 |
| 2003/0147059 | A1 * | 8/2003 | Tokuda | ............... | G03F 7/70941 |
| | | | | | 355/53 |

FOREIGN PATENT DOCUMENTS

| | | |
|---|---|---|
| JP | 60-7128 A | 1/1985 |
| JP | 2006-73867 A | 3/2006 |
| JP | 2010-225729 A | 10/2010 |

* cited by examiner

*Primary Examiner* — Phillip A Johnston
(74) *Attorney, Agent, or Firm* — Oblon, McClelland, Maier & Neustadt, L.L.P.

(57) ABSTRACT

In one embodiment, a multi charged particle beam evaluation method includes writing a plurality of evaluation patterns on a substrate by using multi charged particle beams, with a design value of a line width changed by a predetermined change amount at a predetermined pitch, measuring the line widths of the plurality of evaluation patterns thus written, and extracting a variation in a specific period of a distribution of differences between results of a measurement value and the design value of each of the line widths of the plurality of evaluation patterns. The predetermined change amount is equal to or larger than data resolution and smaller than a size of each of pixels, each of which is a unit region to be irradiated with one of the multi charged particle beams.

17 Claims, 8 Drawing Sheets

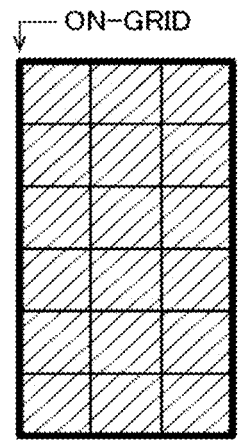
FIG. 5A
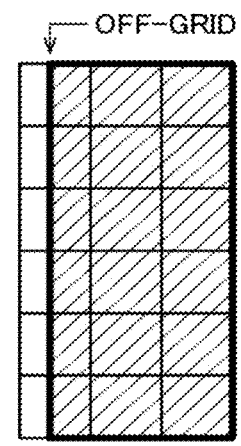
FIG. 5B
FIG. 6
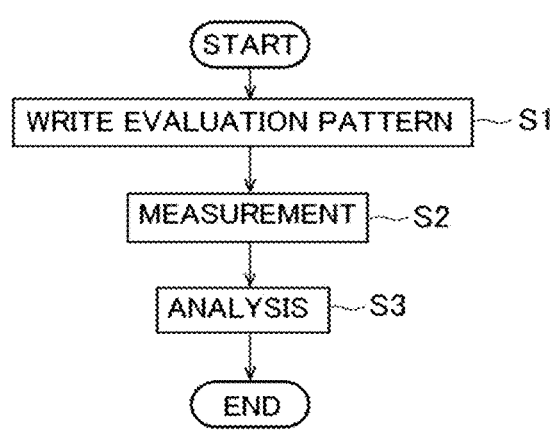

MULTI CHARGED PARTICLE BEAM EVALUATION METHOD AND MULTI CHARGED PARTICLE BEAM WRITING DEVICE

CROSS REFERENCE TO RELATED APPLICATION

This application is based upon and claims benefit of priority from the Japanese Patent Application No. 2019-164710, filed on Sep. 10, 2019, the entire contents of which are incorporated herein by reference.

FIELD

The present invention relates to a multi charged particle beam evaluation method and a multi charged particle beam writing device.

BACKGROUND

As LSI circuits are increasing in density, the line width of circuits of semiconductor devices is becoming finer. To form a desired circuit pattern onto a semiconductor device, a method of reducing and transferring, by using a reduction-projection exposure apparatus, onto a wafer a highly precise original image pattern (mask, or reticle, in particular, when used in a stepper or a scanner) formed on a quartz is employed. The highly precise original image pattern is written by using an electron beam writing apparatus, in which a technology commonly known as electron beam lithography is used.

A writing apparatus that uses a multi-beam can irradiate with many beams at one time, as compared with when writing is performed with a single electron beam, thus the throughput can be significantly improved. In a multi-beam writing apparatus using a blanking aperture array, as an embodiment of the multi-beam writing apparatus, for example, an electron beam discharged from an electron gun passes through a shaping aperture array having multiple openings, and forms a multi-beam (multiple electron beams). The multi-beam passes through the corresponding later-described blankers of the blanking aperture array. The blanking aperture array has electrode pairs for individually deflecting the beams, and an opening for beam passage is formed between each electrode pair. Blanking control on a passing electron beam is performed by controlling the electrode pair (blanker) at the same potential or at different potentials. An electron beam deflected by the blanker is shielded, and an electron beam not deflected by the blanker is emitted to a substrate.

A multi-beam writing device divides a writing region of a substrate into a plurality of pixels in a mesh-like manner and writes a desired pattern by a combination of pixel patterns (bit patterns) formed by irradiating pixels with necessary doses of beams. In a case where a pixel size is a beam size, a single pixel is irradiated with a single beam. A drawing pattern defined in writing data is allocated to pixels, and a dose (an irradiation amount) of each pixel is calculated based on an area density of the drawing pattern in the pixel. Accordingly, assume that a dose of a beam with which a pixel having an area density of 100% is irradiated is 100%, some beams have a dose of less than 100%.

In multi-beam writing, irradiation positions of some beams may be deviated, for example, due to characteristics of an optical system. In multi-beam writing, beams are collectively deflected, and therefore positions of the beams cannot be individually corrected. Therefore, dose modulation processing for distributing a dose of a beam to surrounding beams in accordance with a deviation amount of the position of the beam so that influence of the deviation of the position of the beam does not appear in a dose distribution given to a resist even in a case where exposure is performed by using the deviated beam.

As described above, there are a large number of beams (gray beams) whose doses are not 100% due to pattern area densities of corresponding pixels and the dose modulation processing. This may affect dimensional accuracy and positional accuracy of a written pattern unless the doses are properly adjusted. Furthermore, influence of blur of the beams may appear. For these reasons, there are demands for a technique for quantitatively and easily evaluating controllability and resolution of the gray beams.

BRIEF DESCRIPTION OF THE DRAWINGS

FIG. 5A illustrates an example of on-grid, and FIG. 5B illustrates an example of off-grid.

FIG. 6 is a flowchart for explaining a multi-beam evaluation method according to the embodiment.

DETAILED DESCRIPTION

In one embodiment, a multi charged particle beam evaluation method includes writing a plurality of evaluation patterns on a substrate by using multi charged particle beams, with a design value of a line width changed by a predetermined change amount at a predetermined pitch, measuring the line widths of the plurality of evaluation patterns thus written, and extracting a variation in a specific period of a distribution of differences between results of a measurement value and the design value of each of the line widths of the plurality of evaluation patterns. The predetermined change amount is equal to or larger than data resolution and smaller than a size of each of pixels, each of which is a unit region to be irradiated with one of the multi charged particle beams.

Hereinafter, the embodiment of the present invention will be described based on the drawings. In the embodiment, a configuration using an electron beam as an example of a beam will be described. However, the beam is not limited to the electron beam, and may be a beam using a charged particle beam such as an ion beam, or a laser light.

Figure 1:
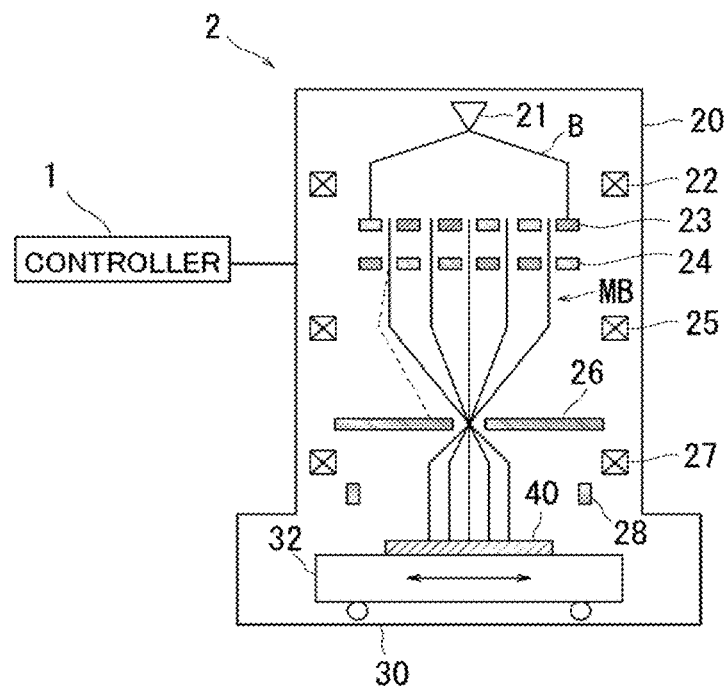
FIG. 1 is a schematic view of a multi charged particle beam writing device according to an embodiment of the present invention.

FIG. 1 schematically illustrates a configuration of a writing device according to the present embodiment. The writing device includes a controller 1 and a writing unit 2 (a writer). The writing device is an example of a multi charged particle beam writing device. The writing unit 2 includes an electron-optical column 20 and a writing chamber 30. In the electron-optical column 20, an electron gun 21, a lighting lens 22, a shaping aperture array substrate 23, a blanking aperture array substrate 24, a reducing lens 25, a limiting aperture member 26, an objective lens 27, and a deflector 28 are disposed. Both of the reducing lens 25 and the objective lens 27 are electromagnetic lenses, and the reducing lens 25 and the objective lens 27 constitute a reducing optical system.

In the writing chamber 30, an XY stage 32 is disposed. On the XY stage 32, a substrate 40 on which a pattern is to be written is placed. The substrate 40 is, for example, an exposure mask for production of a semiconductor device, a semiconductor substrate (silicon wafer) on which a semiconductor device is to be formed, or a mask blank that is coated with a resist and on which nothing has been written yet.

The shaping aperture array substrate 23 has openings that are arranged in a matrix of m rows and n columns (m and n are equal to or larger than 2) at a predetermined pitch. The openings are rectangles or circles having the same dimensional shape.

An electron beam B emitted from the electron gun 21 irradiates all of the openings of the shaping aperture array substrate 23 almost vertically due to the lighting lens 22. By passing the openings of the shaping aperture array substrate 23, the electron beam B forms m×n electron beams (multibeams) MB.

The blanking aperture array substrate 24 has passing holes at positions corresponding to the openings of the shaping aperture array substrate 23. In each of the passing holes, a pair of two electrodes (a blanker: blanking deflector) is disposed. One of the two electrodes for each beam is connected to an amplifier for applying a voltage, and the other one of the two electrodes is grounded. The electron beams passing the respective passing holes are independently deflected by voltages applied to the pairs of two electrodes. Blanking control is performed by this deflection of the electron beams.

The multibeams MB that have passed the blanking aperture array substrate 24 are reduced by the reducing lens 25 and travel toward an opening formed at a center of the limiting aperture member 26. The electron beams deflected by the blankers of the blanking aperture array substrate 24 are displaced from the opening at the center of the limiting aperture member 26 and are blocked by the limiting aperture member 26. Meanwhile, electron beams that have not been deflected by the blankers pass the opening at the center of the limiting aperture member 26.

As described above, the limiting aperture member 26 blocks beams that have been deflected to a beam-OFF state by the blankers. A single shot of beams is formed by the beams that have passed the limiting aperture member 26 among beams formed from beam ON to beam OFF.

The multibeams MB that have passed the limiting aperture member 26 are focused by the objective lens 27 to become a pattern image of a desired reduction rate, are collectively deflected by the deflector 28, and irradiate the substrate 40. For example, in a case where the XY stage 32 is moving continuously, irradiation positions of the beams are controlled by the deflector 28 to follow the movement of the XY stage 32.

The multibeams MB that are applied at one time are ideally arranged at a pitch obtained by multiplying the pitch of the openings of the shaping aperture array substrate 23 by the desired reduction rate. The writing device performs writing operation by a raster scanning method for successively applying shot beams in order. When a desired pattern is written, beams necessary for the pattern are controlled to beam ON by blanking control.

Figure 2:
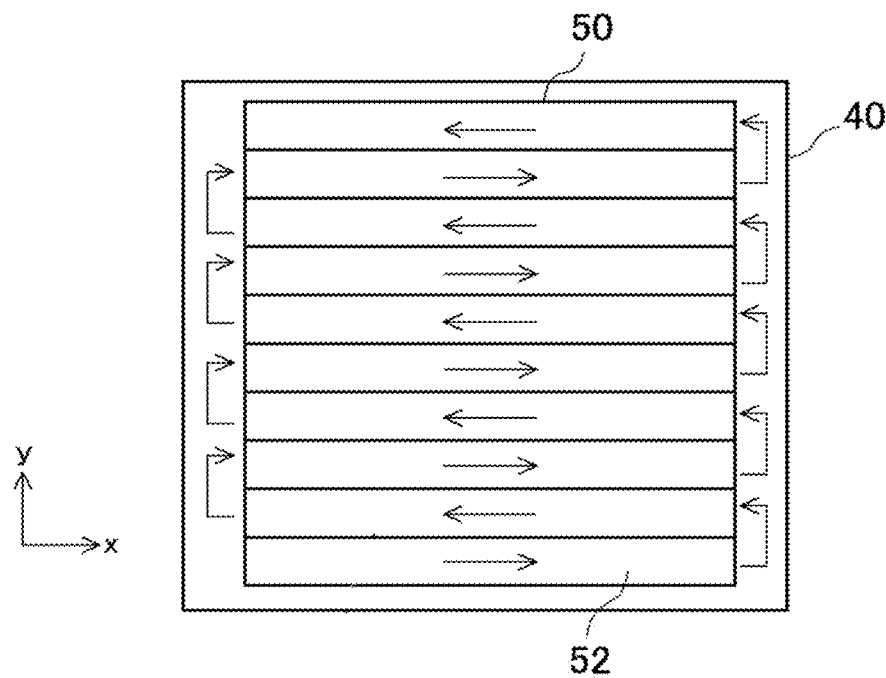
FIG. 2 is a view for explaining an example of scan operation.

As illustrated in FIG. 2, a writing region 50 of the substrate 40 is, for example, virtually divided into a plurality of stripe regions 52 each having a strip shape of a predetermined width in a y direction. For example, the XY stage 32 is moved so that an irradiation region that can be irradiated by single irradiation of multibeams MB is located at a left end of an initial one of the stripe regions 52. After this adjustment, writing starts. By moving the XY stage 32 in a −x direction, writing can be performed in an x direction relatively.

After the writing of the initial one of the stripe regions 52 is finished, the stage position is moved in a −y direction so that the irradiation position is located at a right end of the second one of the stripe regions 52. After this adjustment, writing starts. By moving the XY stage 32, for example, in the x direction, writing is performed in the −x direction.

Writing is performed in the x direction in the third one of the stripe regions 52, and writing is performed in the −x direction in the fourth one of the stripe regions 52. In this way, writing is performed while alternately changing the direction. This can shorten a writing time. Note, however, that writing need not be performed while alternately changing the direction, and writing of the stripe regions 52 may be performed in the same direction.

FIGS. 3A to 3D are views for explaining an example of writing operation within the stripe region 52. FIGS. 3A to 3D illustrate an example of writing within the stripe region 52 with use of 4×4 multibeams in the x and y directions.

The stripe region 52 is, for example, divided into a plurality of pixel regions PX (hereinafter referred to as pixels PX) in a grid-like manner. In this example, exposure (writing) of a single irradiation region of the multibeams is performed by 16 shots while shifting the irradiation position by one pixel PX in the x direction or the y direction. A single pixel PX is a unit region irradiated with a single beam. That is, a size of each pixel PX is a beam size.

Figure 3A:
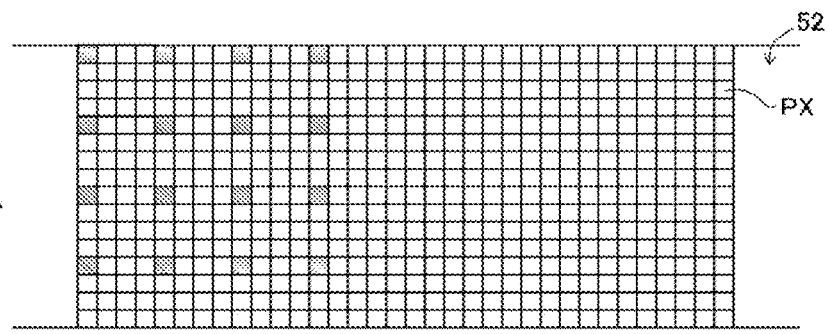
FIGS. 3A to 3D are views for explaining an example of writing operation.
Figure 3B:
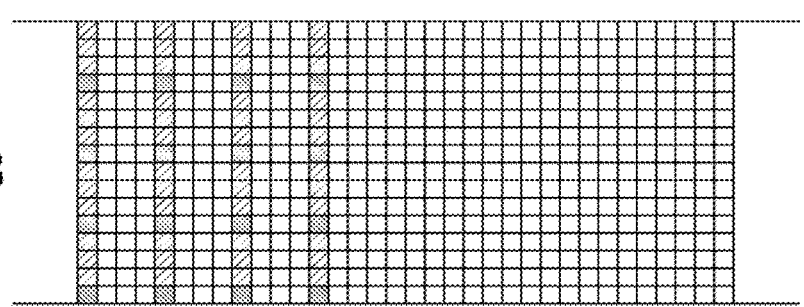
Figure 3C:
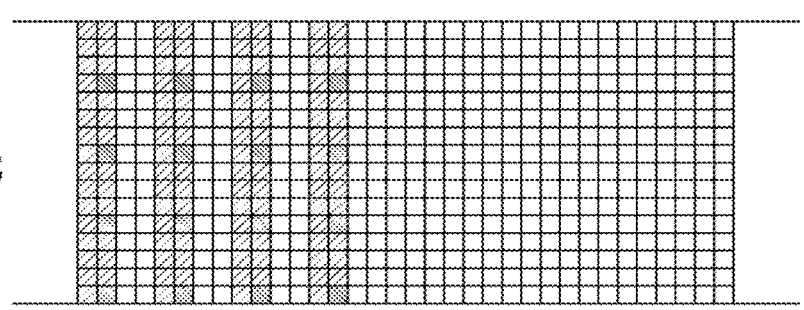
Figure 3D:
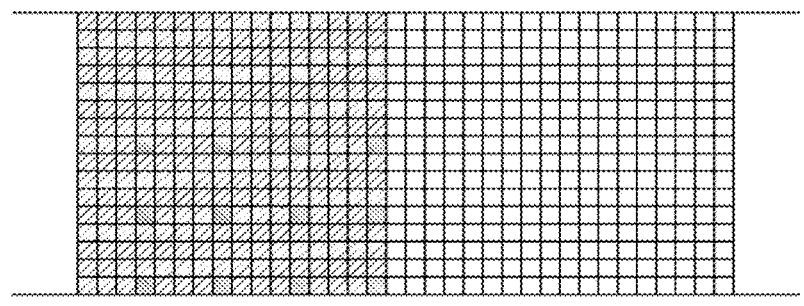

FIG. 3A illustrates pixels PX irradiated by a single shot. Next, as illustrated in FIG. 3B, the second, third, and fourth shots are sequentially performed while shifting the position by a single pixel in the y direction. Then, as illustrated in FIG. 3C, the fifth shot is performed after shifting the position by a single pixel in the x direction. Next, the sixth, seventh, eighth shots are sequentially performed while shifting the position by a single pixel in the y direction. By repeating similar operation, remaining ninth to sixteenth shots are sequentially performed as illustrated in FIG. 3D. By the sixteen shots, writing of a range defined by a beam pitch can be performed by a single beam.

In the writing processing, the controller 1 reads out writing data from a storage unit (not illustrated) and calculates pattern area densities ρ of all of the pixels PX within each of the stripe regions 52 by using a pattern defined in the writing data. The controller 1 calculates doses $\rho D_0$ of beams with which the pixels PX are irradiated by multiplying the pattern area densities ρ by a reference dose $D_0$.

For example, in a case where a line pattern is allocated to the pixels, pixels at an end in a short-side direction of the pattern have a pattern area density ρ of 100% or a pattern area density ρ of less than 100%. In a case where the pixels at the end have a pattern area density ρ of 100%, an edge of the pattern (the shaded part in FIG. 4A) and a boundary of the pixels PX match each other as illustrated in FIG. 4A.

Figure 4A:
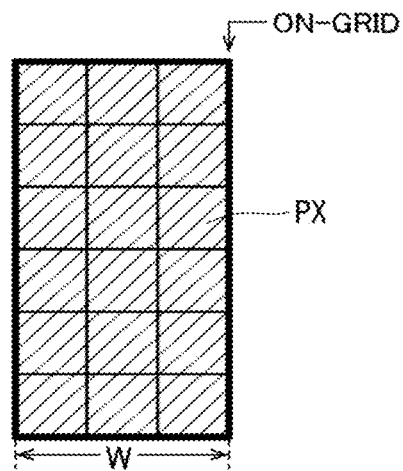
FIG. 4A illustrates an example of on-grid.
Figure 4B:
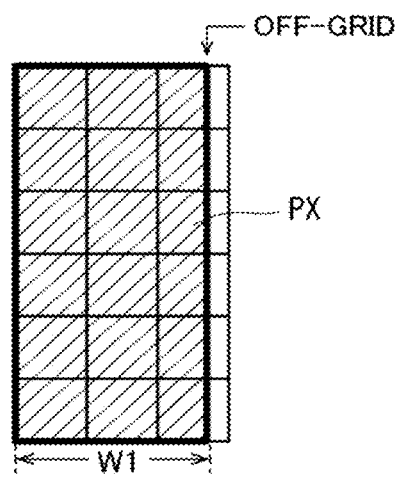
FIGS. 4B and 4C illustrate an example of off-grid.
Figure 4C:
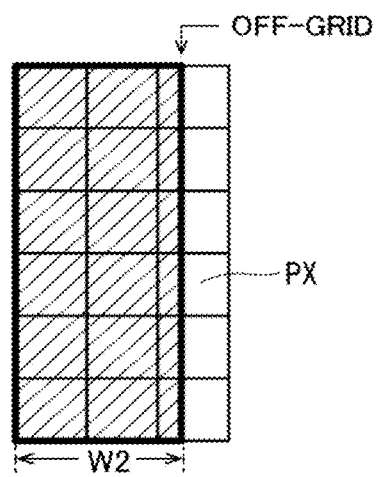

In a case where the pixels at the end have a pattern area density ρ of less than 100%, the edge of the pattern and a boundary of the pixels PX do not match each other as illustrated in FIGS. 4B and 4C. The pixels at the end are irradiated with gray beams whose doses correspond to the pattern area densities ρ of the pixels. By adjusting doses of the pixels at the end, a line width (W, W1, W2) of the line pattern can be controlled.

Although FIGS. 4A to 4C illustrate an example in which doses of pixels PX at a right end are adjusted, doses of pixels PX at a left end may be adjusted as illustrated in FIGS. 5A and 5B.

Hereinafter, a state in which an edge of a pattern and a boundary of pixels PX match each other as illustrated in FIGS. 4A and 5A is referred to as "on-grid", and a state where pixels PX are irradiated with gray beams and an edge of a pattern and a boundary of the pixels PX do not match each other as illustrated in FIGS. 4B, 4C, and 5B is referred to as "off-grid".

As described above, in multi-beam writing, a dimension and a position of a pattern can be controlled by a size smaller than a beam size in the x direction or the y direction and larger than data resolution by adjusting doses (gradation values indicative of irradiation periods) of pixels. It is therefore necessary to evaluate controllability and resolution of gray beams.

As illustrated in FIG. 6, a method for evaluating controllability of beam irradiation amounts (doses) of multibeams according to the present embodiment includes an evaluation pattern writing step (step S1), a step (step S2) of measuring a dimension of a written evaluation pattern, and a step (step S3) of analyzing controllability of doses based on a result of the dimensional measurement.

Figure 7:
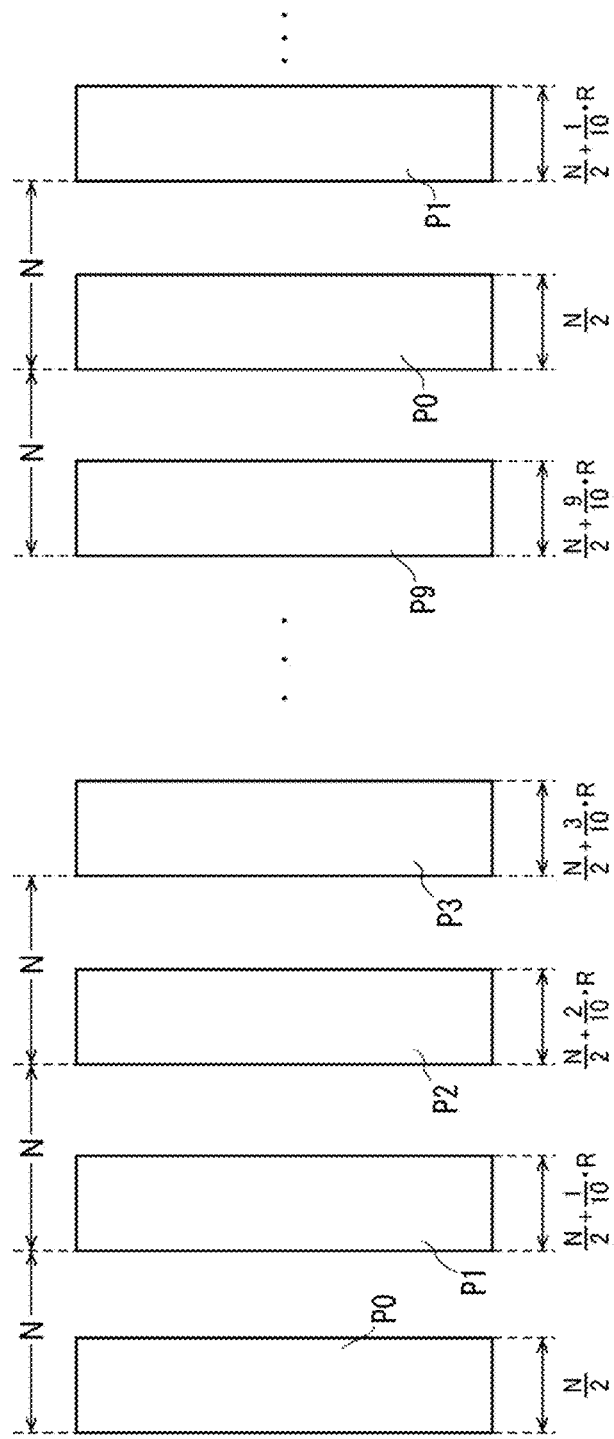
FIG. 7 illustrates an example of evaluation patterns.

In the evaluation pattern writing step, a plurality of line patterns are written as evaluation patterns on the substrate 40 at a predetermined pitch N in parallel with one another while gradually changing a line width by a step equal to or larger than data resolution and equal to or smaller than a beam size (pixel size) as illustrated in FIG. 7 without moving the XY stage 32. For example, the pitch N is a size by which a single beam can be deflected by the deflector 28. A pitch between one edge (edge on the left in FIG. 7) in a line width direction of one line pattern and one edge (edge on the left in FIG. 7) in a line width direction of an adjacent line pattern is fixed at the same value N. A single line pattern is written by a single beam. The plurality of line patterns are concurrently written by respective different beams.

The different beams are beams that have passed different openings of the shaping aperture array substrate 23. In other words, the different beams are beams that have passed different passing holes of the blanking aperture array substrate 24. The line width direction (width direction) of a line pattern is a short-side direction of the line pattern. The line width direction of a line pattern is orthogonal to a longitudinal direction (extending direction) of the line pattern.

In the example illustrated in FIG. 7, the beam size is R, and the line width is changed by increments of R/10. Specifically, the evaluation patterns are written so that a pattern P0 having a line width N/2, a pattern P1 having a line width N/2+R/10, a pattern P2 having a line width N/2+2R/10, a pattern P3 having a line width N/2+3R/10, . . . , and a pattern P9 having a line width N/2+9R/10 are repeatedly disposed. For example, in a case where the beam size R is 10 nm, the line width is changed by increments of 1 nm from the pattern P0 to the pattern P9.

Patterns having different line widths can be written while fixing the pitch N by adjusting doses of pixels at an end (right end in FIG. 7) in the width direction of each pattern.

The pattern P0 is on-grid at both ends thereof. The patterns P1 through P9 are on-grid at left ends thereof and off-grid at right ends thereof.

During writing of the evaluation patterns, it is preferable to turn off correction functions such as distortion correction of the blanking aperture array substrate 24 and flexure correction of the substrate 40. Pattern data of an evaluation pattern is disposed at a start coordinate of a mesh that divides the writing region into pixels, and writing data is generated so that a pitch at which the pattern data is disposed becomes an integral multiple of the mesh. By performing writing based on this writing data, complete on-grid writing is realized. By comparison with this, more precise on/off grid evaluation can be conducted. Furthermore, on-grid and off-grid in multipass writing may be evaluated by performing writing so that on-grid and off-grid overlap each other.

After writing of such evaluation patterns, development and etching are performed, and line widths of the patterns formed on the substrate 40 are measured, for example, by a scanning electron microscope (SEM).

Figure 8:
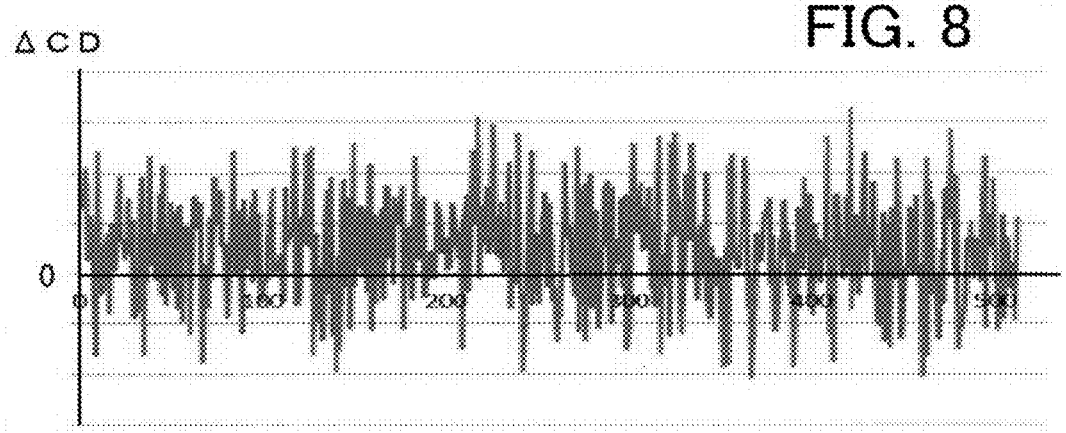
FIG. 8 is a graph illustrating an example of a distribution of differences between results of dimensional measurement of evaluation patterns and design values.

In the analyzing step, differences (ΔCD) between the results of the measurement of the line widths and design values are calculated. When the calculated differences are plotted in the order of the patterns, a graph illustrated in FIG. 8 is, for example, obtained. In order to extract the variation in a distribution of the differences in a specific period, Fast Fourier transform (FFT) is performed on the distribution of the differences to calculate a spatial frequency. In a case where a peak value of the spatial frequency is equal to or smaller than a predetermined threshold value, it is determined that desired writing precision has been successfully achieved. In a case where the peak value of the spatial frequency is larger than the predetermined threshold value, it is determined that there is a possibility of occurrence of process variations, gradation shift and focus shift of gray beams, and the like.

By thus writing evaluation patterns whose dimension is gradually changed by changing amount of a size less than a beam size, performing FFT on results of measurement of the dimensions of the evaluation patterns, and checking occurrence of a predetermined cycle, controllability and resolution of gray beams can be evaluated easily and quantitatively.

Although an example in which the line width of the evaluation patterns illustrated in FIG. 7 is increased from N/2 by increments of R/10 has been described, the line width may be decreased by increments of R/10. A difference in line width between evaluation patterns is not limited to R/10. A pitch between evaluation patterns is not limited to N and may be k×N (k is an integer of 2 or more). A standard line width of an evaluation pattern is not limited to N/2 and may be j×N (j is an integer of 1 or more).

Although an example in which the line width is changed while fixing the pitch between evaluation patterns has described above, the line width may be changed while fixing the line width.

Figure 9:
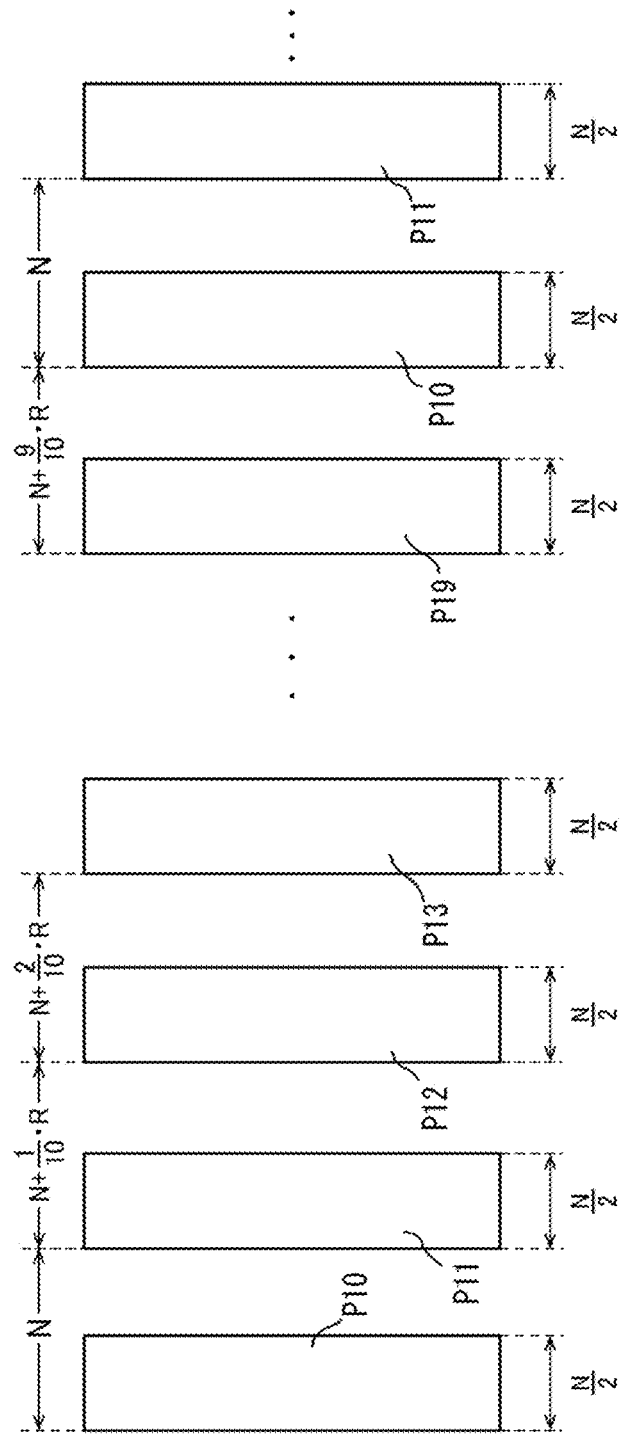
FIG. 9 illustrates an example of evaluation patterns.

For example, evaluation patterns each having a line width of N/2 are written by changing a pitch by increments of R/10, which is equal to or larger than data resolution, as illustrated in FIG. 9. Specifically, patterns P10 through P19 are repeatedly disposed so that a pitch between the patterns P10 and P11 is N, a pitch between the patterns P11 and P12 is N+R/10, a pitch between the patterns P12 and P13 is N+2R/10, . . . and a pitch between the patterns P19 and P10 is N+9R/10. For example, in a case where the beam size R is 10 nm, a pitch between patterns is changed by increments of 1 nm.

By adjusting doses of pixels at both ends in a width direction of each pattern, evaluation patterns can be written at a gradually changing pitch while fixing the line width. For example, the pattern P10 is on-grid at both ends thereof. The pattern P11 is on-grid at a left end thereof and is off-grid at a right end thereof. The patterns P12 through P19 are off-grid at both ends thereof.

The line widths of the written patterns are measured, and a spatial frequency of a distribution of differences between results of the measurement of the line widths and design values is obtained. From this spatial frequency, an abnormality in a specific cycle can be easily found. Furthermore, a pitch at which the patterns are written is measured, and a spatial frequency of a distribution of differences between results of the measurement and design values is obtained. From this spatial frequency, controllability of writing positions can be evaluated.

As evaluation patterns, linear patterns each having a plurality of rectangular parts connected in a longitudinal direction so as to be shifted from each other in a width direction by increments of a shift width less than a beam size may be written at a certain pitch.

Figure 10:
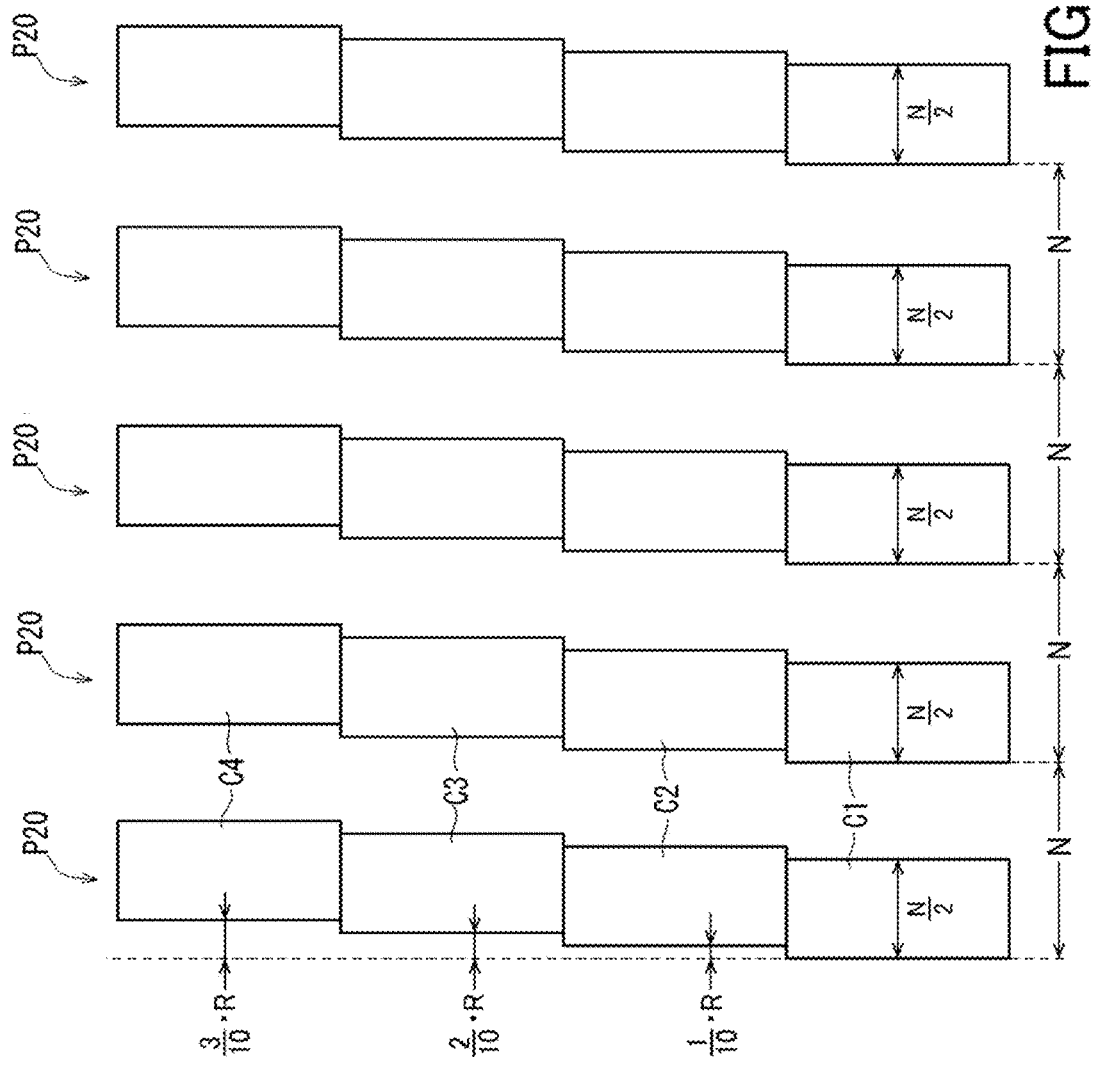
FIG. 10 illustrates an example of evaluation patterns.

For example, as illustrated in FIG. 10, a single linear pattern P20 has rectangular parts C1 through C4 each having a width of N/2, and the rectangular parts C1 through C4 are connected so as to be shifted from each other in a width direction by increments of R/10. Specifically, the rectangular part C2 is shifted from the rectangular part C1 by R/10 in the width direction, the rectangular part C3 is shifted from the rectangular part C1 by 2R/10 in the width direction, and the rectangular part C4 is shifted from the rectangular part C1 by 3R/10 in the width direction. The plurality of patterns P20 are written at a predetermined pitch N.

By adjusting doses of pixels at both ends in the width direction of each rectangular part, a linear pattern having rectangular parts that are connected so as to be shifted from each other can be written. The rectangular part C1 of each of the patterns P20 is on-grid at both ends thereof in the width direction. The rectangular parts C2 through C4 of each of the patterns P20 are off-grid at both ends thereof in the width direction.

Line widths of the rectangular parts of the written patterns are measured, and a spatial frequency is obtained based on differences between results of the measurement of the line widths and design values. From this spatial frequency, an abnormality in a specific cycle can be easily found. Furthermore, influence of distortion of the blanking aperture array substrate 24 can be removed by taking into consideration the result of the measurement of the line width of the rectangular part C1 that is on-grid at both ends thereof.

The evaluation patterns may be written by multiple writing. On-grid pixels at an end and off-grid pixels at an end in the first pass of the writing may be exchanged with each other in the second pass of the writing. Furthermore, the evaluation patterns are not limited to linear patterns and may be, for example, contact-hole patterns, provided that the evaluation patterns have a constant line width.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A multi charged particle beam evaluation method comprising:
   writing a plurality of evaluation patterns on a substrate by using multi charged particle beams, with a design value of a line width changed by a predetermined change amount at a predetermined pitch;
   measuring the line widths of the plurality of evaluation patterns thus written; and
   extracting a variation in a specific period of a distribution of differences between results of a measurement value and the design value of each of the line widths of the plurality of evaluation patterns,
   wherein the predetermined change amount is equal to or larger than data resolution and smaller than a size of each of pixels, each of which is a unit region to be irradiated with one of the multi charged particle beams.

2. The method according to claim 1, wherein the variation in the specific period is extracted by analyzing a spatial frequency.

3. The method according to claim 1, wherein
   the writing is performed while turning a correction function off.

4. The method according to claim 3, wherein
   writing data of the evaluation patterns is generated so that pattern data of each of the evaluation patterns is disposed at a start coordinate of a mesh that divides a writing region into the pixels and a pitch at which the pattern data is disposed is an integral multiple of the mesh.

5. The method according to claim 1, wherein
   the plurality of evaluation patterns are concurrently written by using different beams of the multi charged particle beams.

6. A multi charged particle beam evaluation method comprising
   writing a plurality of evaluation patterns on a substrate by using multi charged particle beams, with a design value of pitch changed by a predetermined change amount;
   measuring the pitches at which the plurality of evaluation patterns are written; and
   extracting a variation in a specific period of a distribution of differences between results of a measurement value and the design value of each of the pitches,
   wherein the predetermined change amount is smaller than a size of each of pixels, each of which is a unit region to be irradiated with one of the multi charged particle beams.

7. The method according to claim 6, wherein the variation in the specific period is extracted by analyzing a spatial frequency.

8. The method according to claim 6, wherein
   the writing is performed while turning a correction function off.

9. The method according to claim 8, wherein
   writing data of the evaluation patterns is generated so that pattern data of each of the evaluation patterns is disposed at a start coordinate of a mesh that divides a writing region into the pixels and a pitch at which the pattern data is disposed is an integral multiple of the mesh.

10. The method according to claim 6, wherein
    the plurality of evaluation patterns are concurrently written by using different beams of the multi charged particle beams.

11. A multi charged particle beam evaluation method comprising
- writing a plurality of evaluation patterns each of which have a design value of a line width, on a substrate by using multi charged particle beams, with a predetermined pitch;
- measuring line widths and the pitch of the plurality of evaluation patterns thus written; and
- extracting a variation in a specific period of a distribution of differences between results of a measurement value and the design value of each of the line widths of the plurality of evaluation patterns, wherein
- each of the evaluation patterns has a plurality of rectangular parts that are connected so as to be shifted from each other in a width direction,
- a width by which the plurality of rectangular parts are shifted from each other is equal to or larger than data resolution and is smaller than a size of each of pixels, each of which is a unit region to be irradiated with one of the multi charged particle beams, and
- a line width of each of the plurality of rectangular parts is measured.

12. The method according to claim 11, wherein the variation in the specific period is extracted by analyzing a spatial frequency.

13. The method according to claim 11, wherein
the writing is performed while turning a correction function off.

14. The method according to claim 13, wherein
writing data of the evaluation patterns is generated so that pattern data of each of the evaluation patterns is disposed at a start coordinate of a mesh that divides a writing region into the pixels and a pitch at which the pattern data is disposed is an integral multiple of the mesh.

15. The method according to claim 11, wherein
the plurality of evaluation patterns are concurrently written by using different beams of the multi charged particle beams.

16. A multi charged particle beam writing device comprising:
- a writer writing a pattern on a substrate by using multi charged particle beams; and
- a controller controlling the writer to write a plurality of linear evaluation patterns on the substrate at a predetermined pitch, a design value of the line width of each of the patterns changed by a predetermined change amount which is equal to or larger than data resolution and smaller than a size of each pixels, each of which is a unit region to be irradiated with one of the multi charged particle beams.

17. The device according to claim 16, wherein
the linear evaluation patterns are written while turning a correction function off.

* * * * *